US010144848B2

(12) United States Patent
Buskens et al.

(10) Patent No.: US 10,144,848 B2
(45) Date of Patent: Dec. 4, 2018

(54) THERMALLY CURABLE COATING SYSTEMS

(71) Applicant: Nederlandse Organisatie voor toegepast-natuurwetenschappelijk onderzoek TNO, The Hague (NL)

(72) Inventors: Pascal Jozef Paul Buskens, The Hague (NL); Nanning Joerg Arfsten, The Hague (NL); Maurice Christian Danho Mourad, The Hague (NL); Maria Elizabeth Louise Wouters, The Hague (NL); Leonardus Johannus Maria Genoveva Dortmans, The Hague (NL)

(73) Assignee: NEDERLANDSE ORGANISATIE VOOR TOEGEPAST-NATUURWETENSCHAPPELIJK ONDERZOEK TNO, The Hague (NL)

( * ) Notice: Subject to any disclaimer, the term of this patent is extended or adjusted under 35 U.S.C. 154(b) by 0 days.

(21) Appl. No.: 14/892,126

(22) PCT Filed: May 21, 2014

(86) PCT No.: PCT/NL2014/050322
§ 371 (c)(1),
(2) Date: Nov. 18, 2015

(87) PCT Pub. No.: WO2014/189373
PCT Pub. Date: Nov. 27, 2014

(65) Prior Publication Data
US 2016/0122584 A1 May 5, 2016

(30) Foreign Application Priority Data

May 21, 2013 (EP) .................................... 13168570
May 27, 2013 (EP) .................................... 13169298

(51) Int. Cl.
| | | |
|---|---|---|
| H01B 1/00 | (2006.01) |
| C09D 183/06 | (2006.01) |
| C09D 5/00 | (2006.01) |
| C09D 5/32 | (2006.01) |
| C08F 2/38 | (2006.01) |
| B05D 3/06 | (2006.01) |
| C08K 3/16 | (2006.01) |
| C08K 3/36 | (2006.01) |
| C08K 5/098 | (2006.01) |
| G03F 7/16 | (2006.01) |

(52) U.S. Cl.
CPC ............ *C09D 183/06* (2013.01); *B05D 3/06* (2013.01); *C08F 2/38* (2013.01); *C08K 3/16* (2013.01); *C08K 3/36* (2013.01); *C08K 5/098* (2013.01); *C09D 5/00* (2013.01); *C09D 5/32* (2013.01); *G03F 7/16* (2013.01)

(58) Field of Classification Search
CPC ................ C08K 3/30; H01B 1/00; B32B 5/16
USPC ............. 503/201; 427/8; 700/266; 524/500, 524/423; 252/500
See application file for complete search history.

(56) References Cited

U.S. PATENT DOCUMENTS

| | | | | |
|---|---|---|---|---|
| 2005/0045855 A1* | 3/2005 | Tonapi | ..................... | C09K 5/14 252/500 |
| 2008/0154431 A1 | 6/2008 | Defries et al. | | |
| 2009/0209420 A1* | 8/2009 | Kalgutkar | ................ | B32B 5/16 503/201 |
| 2009/0270541 A1* | 10/2009 | Shinba | .................. | C08F 290/00 524/423 |
| 2009/0304905 A1 | 12/2009 | Graham et al. | | |
| 2010/0166976 A1 | 7/2010 | Lin et al. | | |

FOREIGN PATENT DOCUMENTS

| | | |
|---|---|---|
| JP | 2006-169544 A | 6/2006 |
| JP | 2007-31216 A | 2/2007 |
| JP | 2008-45024 A | 2/2008 |
| JP | 2009-28692 A | 2/2009 |
| JP | 2010-24121 A | 2/2010 |
| WO | 2004083319 A1 | 9/2004 |
| WO | 2010107720 A2 | 9/2010 |

OTHER PUBLICATIONS

Shi, et al., Materials and technologies of abrasion-resistant and corrosion resistant coating films, Chemical Industry Press, pp. 226-227, 2003 corresponding to Chinese Application No. 201480035380.0 Office Action dated Jan. 9, 2017.
International Search Report and Written Opinion based on International Application No. PCT/NL2014/050322 dated Aug. 20, 2014. (12 Pages).

* cited by examiner

*Primary Examiner* — Khanh Tuan Nguyen
(74) *Attorney, Agent, or Firm* — Lucas Mercanti, LLP

(57) ABSTRACT

The invention relates to a curable coating composition, a method for curing a curable coating composition and an article comprising a cured composition. The curable coating composition of the invention comprises a thermally curable component and plasmonic particles. The method of the invention concerns a method for curing a curable coating composition comprising plasmonic particles and comprises: exposing the curable coating composition to light comprising electromagnetic waves that are at least partially concentrated by the plasmonic particles.

20 Claims, No Drawings

THERMALLY CURABLE COATING SYSTEMS

CROSS-REFERENCE TO RELATED APPLICATIONS

This application is a 371 of PCT/NL2014/050322, filed May 21, 2014, which claims the benefit of European Patent Application No. 13168570.3, filed May 21, 2013 and European Patent Application No. 13169298.0, filed May 27, 2013.

The invention relates to a curable coating composition, a method for curing a curable coating composition and an article comprising a cured composition.

Thermally curable coating compositions require thermal treatment at elevated temperature to cure the coating. For example, a sol-gel coating may require a typical curing temperature of 400° C. or more, or even 450° C. or more. In order to improve the quality of the obtained coatings, the energy efficiency of the coating and curing process, to reduce the cycle time required for curing and to be able to apply such coatings on thermally labile substrates (such as polymer films), various methods have been explored to reduce the curing temperature. Approaches to address these limitations include the addition of a curing catalyst, the addition of water vapour during curing of sol-gel coatings, microwave assisted curing, ion beam treatment and vacuum combined with UV irradiation. With these approaches, both the bulk substrate and the coating are still subjected to elevated temperatures for a relatively long period of time. In addition, they often require expensive equipment and/or are not practical for use on an industrial scale.

Thermally cured coatings, such as sol-gel $Si_2$ coatings, typically exhibit excellent mechanical and chemical stability. Other, specific coating properties such as a specific level of electrical conductivity or a specific level of transparency in the visible can e.g. be added through addition of functional components to the coating composition.

The inventors found that plasmons may be advantageously for use in thermal curing of coating compositions. Directing light waves at the interface between a conductive material (such as a metal) and a dielectric can induce a resonant interaction between the waves and the mobile electrons at the surface of the conductive material. In a conductive metal, the electrons are not strongly attached to individual atoms or molecules. In other words, the oscillations of electrons at the surface match those of the electromagnetic field outside the conductive material. The result is the generation of surface plasmons-density waves of electrons that propagate along the interface like the ripples that spread across the surface of a pond after you throw a stone into the water.

WO-A-2004/083319 to Park describes a composition for producing a heat-ray cut-off film, comprising conductive nanoparticles uniformly dispersed in an amphoteric solvent, a dispersing agent, and a resin binder. The document does not suggest that the particles contribute to curing. In Example 3, a UV hardening resin is cured with a mercury lamp.

WO-A-2010/107720 to Vo-Dinh describes a system for energy up and/or down conversion. The invention uses light activated curing polymers. This document does not disclose a thermally curable material.

US-A-2009/0 304 905 to Graham discloses coating compositions containing resins with dispersed precursors of nanoparticles. Nanoparticles can be formed during a thermal impact event to an already cured coating. Hence, nanoparticles are only present in the cured coatings.

US-A-2010/0 166 976 to Lin describes a method for manufacturing core-shell nanostructures. A thermosetting material precursor is provided and nanoparticles are applied thereon, then it is coated with thermosetting material precursor, thereafter the nanoparticles are irradiated with light, light energy is converted in thermal energy and thermosetting material precursor around each nanoparticle is cured to form a shell with a thickness of only 1 nm to 100 nm, in the examples of 10 nm and 20 nm. FIG. 8 shows that a light flux of at least $10^4$ $W/cm^2$ is necessary for an increase of the surface temperature of an Au nanoparticle in water with 10K. Embodiments of the present invention in contrast provide cure throughout the coating, optionally at lower light fluxes.

The use of plasmonic particles as heat source for chemical processes has recently been reported. Steam reforming of ethanol inside a micro channel using plasmonic heating by gold nanoparticles has been described by Adleman et al. (*Nano Letters* 2009, 9, 4418-4423). A laser (50 mW, 10±2 μm diameter) within or near the frequency of the plasmon resonance band (centred around 532 nm) of ~20 nm gold nanoparticles was focused on the top of a glass support, and the subsequent heat generated in the nanoparticles was transferred to the surrounding fluid which formed a vapour. The vapour phase components reacted, thereby forming gas bubbles which were carried downstream in a microfluidic 40 μm height glass/polydimethylsiloxane (PDMS) channel.

Neumann et al. (*ACS Nano* 2013, 7, 42-49) describe solar vapour generation using broadly absorbing metal or carbon nanoparticles dispersed in a liquid phase, namely water. They report an increase of the surface temperature of the nanoparticles above the boiling point of the liquid.

Vapour that formed around the nanoparticles resulted in bubbles composed of nanoparticles enveloped by a vapour shell. The bubbles, comprising nanoparticles, moved to a liquid-air interface where steam was released. They also describe distillation of ethanol-water mixtures (20 ml) with Au nanoshell particles in dispersion ($2.5 \times 10^{10}$ particles/ml) using focused sunlight.

Objective of the present invention is to provide a curable coating composition addressing the above-mentioned limitations of coatings and processes at least in part. In a preferred aspect, the limitations of sol-gel coatings are addressed.

Specifically, an objective is to provide coating compositions that can be cured whilst not increasing the bulk substrate temperature by more than 150° C.

Surprisingly it has now been found that such coating compositions can be provided when use is made of plasmonic structures.

Accordingly, in a first aspect the invention relates to a curable coating composition comprising a thermally curable component and plasmonic particles.

In a further aspect, the invention relates to a method for curing a curable coating composition comprising plasmonic particles, and typically a thermally curable component, preferably a curable coating composition as described herein, wherein said method comprises: exposing the curable coating composition to light comprising electromagnetic waves that are at least partially concentrated by the plasmonic particles.

In yet a further aspect, the invention relates to an article comprising a composition as described herein, wherein the composition is cured.

The term "coating" as used in this application is meant to refer to its conventional meaning as defined e.g. by ISO 4618:2006, i.e. a continuous layer formed from a single or multiple application of a coating material to a substrate. Coating materials can be in gaseous, liquid or solid form. The cured coating is solid and typically comprises plasmonic particles dispersed in the cured thermally curable component, such as a solid metal oxide. The particles can for example be dispersed in a solid matrix having a composition different from the composition of the plasmonic particles.

The term "plasmonic structure" as used in this application is meant to refer to a nanoparticle (for instance a conductive nanoparticle, in particular a nanoparticle comprising an electrically conductive component) or nanostructure capable of concentrating light of a frequency at or close to the plasmonic resonance frequency, thereby developing a surface plasmon.

The term "plasmon" as used in this application is meant to refer to a surface plasmon. By analogy, the term "plasmonic" as used in this application is meant to refer to the presence of surface plasmons. The term "plasmonic particle" as used in this application is meant to refer to a surface-plasmon supporting structure. A plasmonic particle typically is a nanoparticle of an electrically conducting material. This conducting material can be a metal or metallic material such as alloys, but for instance also carbon. This term is meant to include structured surfaces and nanoparticles comprising (electrically) conductive materials. Rather than by their form, size or chemical composition, plasmonic particles are characterised by exhibiting plasmon resonance. The plasmon resonance can be at one or more specific plasmon resonance wavelengths. Rod-like nanoparticles, for example, can have two distinct plasmon resonance wavelengths. It is also possible that plasmon resonance occurs within a certain spectral range. This may depend, for instance, on the particle size distribution of the plasmon particles. As is conventional, the plasmon resonance is expressed as the wavelength in air, although the frequency is more suitable for nano-scale resonance.

The term "plasmonic heating" as used in this application is meant to refer to the dissipation of thermal energy from a plasmonic particle to its environment due to surface plasmon resonance. The surface plasmon resonance is generated upon excitation with light comprising electromagnetic waves that are at least partially concentrated by the plasmonic particles. The phrase: electromagnetic waves that are at least partially concentrated by the "plasmonic particles" includes light with a wavelength coinciding with a plasmonic resonance wavelength of the particles. For example, if a plasmonic resonance wavelength of the particles exists at 350 nm, monochromatic light of 350 nm would be considered such light, but also light from an UV source providing a spectrum from 200 nm to 400 nm is considered such light. The phrase "exposing the curable coating composition to light" as used in this application is meant to include both irradiating the curable coating composition with electromagnetic radiation such as light and illuminating the curable coating composition. The light can typically have a photon energy in the range of from about 0.3 eV to about 3.5 eV and can accordingly comprise ultraviolet (UV), visible, near-infrared (NIR), and infrared (IR) light. The light is can be continuous (CW) or pulsed. The light can be focused, the curable coating composition can also be homogenously exposed e.g. to ambient light, solar light, laser light, and/or light emitting diode (LED) light. In an embodiment, substantially the entire curable coating composition is illuminated.

The term "nanoparticles" as used in this application is meant to refer to particles with at least one dimension of from about 1 nm to about 1000 nm, such as from about 1 nm to about 500 nm, from about 2 nm to about 300 nm, or from about 5 nm to about 200 nm. These dimensions can be measured with laser diffraction as the volume median (Dv50), at least above 10 nm. For smaller particles transmission electron microscopy (TEM) can be used based on number average, equivalent sphere diameter. Nanoparticles for example include spherical or approximately spherical (cuboidal, pyramidal) particles with a diameter (or at least two or three dimensions) in these ranges. In case of spherical particles the one dimension is preferably the diameter of the particles. For non-spherical particles, the on dimension can, for instance, be the equivalent spherical diameter which is defined as the diameter of a sphere of equivalent volume. The term "nanoparticle" is also meant to include rod-like particles, also known as nanorods. Such nanorods typically have an aspect ratio (longest dimension divided by the shortest dimension) in the range of 2-40, more often in the range of 2-20, such as in the range of 3-10. Typically, each of the dimensions of a rod-like nanoparticle is in the range of from about 1 nm to about 1000 nm.

The term "metallic surface nanoparticle" as used in this application is meant to refer to nanoparticles comprising an external surface, said surface comprising at least one metal. The term metallic surface nanoparticle is meant to include metal nanoparticles as well as core-shell nanoparticles with at least a metal-comprising shell and a metallic or non-metallic core. The core can, for instance, be a dielectric material, or a semiconductor material.

The term "conductive surface nanoparticle" as used in this application is meant to refer to nanoparticles comprising a conductive surface, such as a surface comprising a (electrically) conductive material such as a metal. This includes conductive material nanoparticles and nanoparticles with a conductive material shell, such as carbon nanoparticles, metal nanoparticles and metal shell nanoparticles. This includes particles wherein such surface and/or shell is covered by a outer stabilisation layer, such as for silica-stabilised gold nanoparticles.

The term "thermolabile compound" as used in this application is meant to refer to a compound that is unstable when heated; in particular that is subject to loss of characteristic properties on being heated to or above a threshold temperature. The loss of characteristic properties starts at this threshold temperature (for example, after 10 s at this temperature) and typically continues with increasing temperature. The same applies for a thermolabile component and a thermolabile substrate.

Accordingly, a thermolabile component (compound, substrate) labile at temperature of 200° C. or less shows loss of characteristic properties at least at a temperature of 200° C. or less, in addition it may show loss of characteristic properties at higher temperatures.

The curable coating composition of the invention comprises a thermally curable component and plasmonic structures, preferably plasmonic particles. Such plasmonic structures are able to convert light to heat very locally. Surprisingly, this plasmonic heating can be used to cure a thermally curable coating composition whilst not increasing the bulk substrate temperature by more than 150° C. The plasmonic heating provides various advantages compared to conventional thermal curing. The curing is faster (allowing for shorter curing cycle times) and lower energy consumption. Furthermore, plasmonic heating enables such coatings that typically require high temperature curing steps on thermally labile substrates such as polymer films. Using plasmonic heating, the coating can reach the required curing temperature without increasing the bulk substrate temperature to a level at which the substrate becomes instable due to melting, depolymerisation, degradation, etc. In an aspect, it allows for application on thermo labile substrates and allows for the coating composition to comprise thermo labile components.

The curable coating composition is preferably of the sol-gel type. Sol-gel coatings and processes are as such well known. Reference can be made to C. J. Brinker, G. W. Scherer: *Sol-gel Science: The Physics and Chemistry of Sol-Gel Processing* (Academic Press, 1990), which is herewith completely incorporated by reference.

The term "thermally curable component" has the conventional meaning to correspond to a material that solidifies and/or hardens (cures) when its temperature is increased to above its curing temperature. Curing occurs even if the material is not simultaneously exposed radiation. In particular it is not necessary for curing of the material as such that it is exposed to UV-light, visible light, or actinic radiation. The curing is not reversible on decrease of the temperature to below the curing temperature only. Accordingly, before cure, the component is typically a fluid comprising at least a liquid phase.

The composition preferably comprises 10-100 wt. %, more preferably 10-99.9 wt. % more preferably 20-90 wt. % of the thermally curable component, by weight of the curable coating composition absent a or any solvent. The composition preferably comprises 0.1-100 wt. %, more preferably 0.1-99.9 wt. % more preferably 1-90 wt. %, of the thermally curable component, by total weight of the curable coating composition.

The curable composition can comprise one or more solvents. The solvent can include a polar or non-polar solvent, a protic or aprotic solvent, and combinations thereof. Typical solvents include, for example, water methanol, ethanol, i-propanol, n-butanol, methyl ethyl ketone, 1-methoxy-2-propanol, 2-(2-butoxyethoxy)ethanol, and the like. The amount of solvent may be from 0-99.9 wt. % of the total weight of the curable composition, such as from 1-95 wt. %. The curable composition preferably comprises 0.001-10 wt. % water, based on the total weight of the curable composition.

Furthermore, the composition optionally comprises chelating agents (ligands) such as acetyl acetone, ethyl acetoacetate, 2-aminoethanol; surfactants, such as cetyltrimethylammonium bromide (CTAB), polyoxyethylene glycol alkyl ethers (Brij) and sodium dodecyl sulphate (SDS); and other typical coating additives known to the person skilled in the art.

The composition suitably comprises an acid catalyst and/or a base catalyst. Exemplary acid catalysts may be selected from the group consisting of HCl, $HNO_3$, $H_2SO_4$, $CH_3COOH$, $HCO_2H$, $H_3PO_4$, carboxylic acids, sulphonic acids, phosphonic acids, and combinations thereof. The acid catalyst level may be from 0.001-0.1 wt. %, by total weight of the curable coating composition. Exemplary base catalysts may be selected from the group consisting of ammonium hydroxide, NaOH, and KOH. The base catalyst level may be from 0.001-0.1 wt. %, by total weight of the curable coating composition.

The curable composition may comprise as thermally curable component, and/or additionally comprise as other component, monomeric or oligomeric precursors of oxides, nitrides or oxynitrides of scandium, yttrium, lanthanum, actinides, lanthanides, titanium, zirconium, hafnium, vanadium, niobium, tantalum, chromium, molybdenum, tungsten, manganese, technetium, rhenium, iron, ruthenium, osmium, cobalt, rhodium, iridium, palladium, nickel, copper, zinc, cadmium, aluminium, gallium, indium, silicon, germanium, tin, lead, phosphorus, antimony, bismuth, and boron. The composition preferably comprises 10-100 wt. %, or 10-99.9 wt. % more preferably 20-90 wt. % of such compounds, by weight of the curable coating composition absent any solvent.

The curable coating composition may comprise silica sols also known as colloidal silica, silicic acid, polysilicic acid. The curable coating composition may also comprise a polysilicate microgel, silica hydrogel and/or silica particles, preferably with hydroxylated surfaces. These can be included as thermally curable component.

The thermally curable component is preferably curable by a thermal treatment at 200° C. or more, such as at 400° C. or more. The thermal curing step preferably comprises polycondensation.

In an embodiment, the thermally curable component can comprise a metal alkoxyde, nitrate, halide (fluoride, bromide, chloride, or iodide) and/or carboxylate (such as acetate, propionate or butyrate), preferably in an amount of 10-100 wt. %, or 10-99.9 wt. % more preferably 20-90 wt. %, by weight of the curable coating composition absent a solvent.

The metal can, for instance, be selected from the group consisting of scandium, yttrium, lanthanum, actinides, lanthanides, titanium, zirconium, hafnium, vanadium, niobium, tantalum, chromium, molybdenum, tungsten, manganese, technetium, rhenium, iron, ruthenium, osmium, cobalt, rhodium, iridium, palladium, nickel, copper, zinc, cadmium, aluminium, gallium, indium, silicon, germanium, tin, lead, antimony, and bismuth. Preferred metals include aluminium, iron, zirconium, magnesium and silicon are preferred. Metal alkoxides of aluminium, iron, zirconium, magnesium and silicon are particularly preferred. Alkoxydes, nitrates, halides, and/or carboxylates of phosphorus or boron are suitable alternatives to their metal analogues.

Preferably, the metal alkoxydes are represented by the general formula $M(OR)_x$ or $R_yM(OR)_x$, in which M represents a metal such as Ti, Al, Fe, Zr, Mg, Sr, and Si, and each R independently represents an organic alkyl group such as methyl, ethyl, propyl isopropyl, butyl, or aromatic groups. Each of x and y independently represent an integer with a value selected from 1, 2, 3, 4, 5, and 6. Preferably, said metal is silicon and R is methyl or ethyl. Preferably, the thermally curable component comprises an alkoxysilane (including aryltrialkoxysilanes). Sol-gels on the basis of Si remain stable for a longer period of time than sol-gels based on the other metals mentioned above.

A person of skill in the art would be aware of the wide range of metal or metalloid containing compounds which have been employed in the sol-gel process and which, thus, may be candidates for use in the invention. The composition preferably comprises 10-99.9 wt. %, more preferably 20-90 wt. % of the example compounds listed under 1-4, by weight of the curable coating composition absent any solvent.

1. In case the metal is silicon, examples of the curable component include trimethoxysilane, triethoxysilane, tripropoxysilane, tetramethoxysilane (also known as tetramethyl orthosilicate), tetraethoxysilane (also known as tetraethyl orthosilicate), tetrapropoxysilane, methyltrimethoxysilane, ethyltrimethoxysilane, propyltrimethoxysilane, methyltriethoxysilane, ethyltriethoxysilane, propyltriethoxysilane, dimethyldimethoxysilane, diethyldiethoxysilane, γ-chloropropyltriethoxysilane, γ-mercaptopropyltrimethoxysilane, γ-mercaptopropyltriethoxysilane, γ-aminopropyltriethoxysilane, phenyltrimethoxysilane, phenyltriethoxysilane, phenyltripropoxysilane, diphenyldimethoxysilane, and diphenyldiethoxysilane.

Among these, particularly preferred are tetramethoxysilane, tetraethoxysilane, methyltrimethoxysilane, ethyltrimethoxysilane, methyltriethoxysilane, ethyltriethoxysilane, dimethyldimethoxysilane, dimethyldiethoxysilane, phenyltrimethoxysilane, phenyltriethoxysilane, diphenyldimethoxysilane, and diphenyldiethoxysilane.

2. In case the metal is aluminium, examples of the curable component include trimethoxy aluminate, triethoxy aluminate, tripropoxy aluminate, and tetraethoxy aluminate.

3. In case the metal is titanium, examples of the curable component include trimethoxy titanate, tetramethoxy titanate, triethoxy titanate, tetraethoxy titanate, tetrapropoxy titanate, chlorotrimethoxy titanate, chlorotriethoxy titanate, ethyltrimethoxy titanate, methyltriethoxy titanate, ethyltriethoxy titanate, diethyldiethoxy titanate, phenyltrimethoxy titanate, and phenyltriethoxy titanate.

4. In case the metal is zirconium, examples of the curable component include trimethoxy zirconate, tetramethoxy zirconate, triethoxy zirconate, tetraethoxy zirconate, tetrapropoxy zirconate, chlorotrimethoxy zirconate, chlorotriethoxy zirconate, ethyltrimethoxy zirconate, methyltriethoxy zirconate, ethyltriethoxy zirconate, diethyldiethoxy zirconate, phenyltrimethoxy zirconate, and phenyltriethoxy zirconate.

The curable coating composition may also comprise other types of curable components, optionally so as to form a hybrid coating. The sol-gel type curable coating composition can for instance be combined with an epoxy type coating composition, an acrylate type coating composition, a urethane type coating composition, or the like.

Instead of, or in combination with, the cured coating can comprise polymers. Polymeric coatings are well known in the art. Preferably, the plasmonic particles are suspended in a liquid phase in the coating composition, which typically comprises a resin. In an optional embodiment, the plasmonic particles are not catalytic for the polymerisation reaction and/or the polymerisation is not catalysed by the catalytic particles. In an optional embodiment, the coating composition comprises a polymerisation catalyst which is different from the plasmonic particles. Suitably, the coating composition comprises as thermally curable component a thermal hardening resin such as one or more selected from acrylyl, polycarbonate, polychloride vinyl, urethane (hence an isocyanate with for example a polyol), melamine, alkyd, polyester, and epoxy.

Preferably, the coating composition comprises a polymerisable components, such as monomers and/or oligomers, preferably radical polymerisable components (e.g. (meth)acrylic acids) and/or cationic polymerisable components (in particular ethylenically unsaturated compounds, e.g. olefin monomers (in particular styrene), lactones, lactams, and/or cyclic amines; and epoxy and/or vinyl ether).

The coating composition comprises preferably one or more reaction initiations, such as free radical polymerisation initiators and cationic polymerisation initiators, preferably thermal polymerisation initiators. Preferred free radical thermal initiators include compounds that are thermally liable to decompose into radicals to generate polymerisation of radical polymerisable components. Preferred examples include azo compounds, and inorganic and organic peroxide compounds, such as 4,4'-azobis(4-cyanovaleric acid); 4,4'-azobis(4-cyanovaleric acid); 1,1'-azobis(cyclohexanecarbonitrile); 2,2'-azobis(2-methylpropionamidine) dihydrochloride; 2,2'-azobis(2-methylpropionitrile); ammonium persulfate, hydroxymethanesulfinic acid monosodium salt dehydrate, potassium persulfate, sodium persulfate, 2,2-bis(tert-butylperoxy)butane, tert-butyl hydroperoxide solution, tert-butyl hydroperoxide, benzoyl peroxide (BPO).

The curable composition comprises plasmonic structures, preferably plasmonic particles. Plasmonic particles are characterised by exhibiting a plasmon resonance wavelength. The plasmonic particles are preferably plasmonic nanoparticles. Suitable plasmonic particles include particles comprising conductive materials such as metallic materials and carbon.

The plasmonic particles preferably have a plasmon resonance excitation wavelength in the infrared (700 nm to 10 μm), near-infrared (700-1400 nm), visible (400-700 nm) and/or ultraviolet spectrum (250-400 nm). The wavelength of such resonances strongly depends on the size and morphology of the plasmonic particle and the refractive index of its environment. Preferably, the plasmonic particles exhibit plasmonic absorption of at least one wavelength in these ranges.

Surface plasmons as used herein comprise coherent electron oscillations that exist at the interface between two suitable materials such as a conductive material and a dielectric. Typically, the surface of the plasmonic particle comprises the conductive material and the environment is a dielectric. Preferably, the curable coating composition comprises a dielectric phase. Suitable plasmonic particles have a size which is smaller than the wavelength of the plasmon resonance. Plasmonic particles preferably comprise a conductive surface. Accordingly, the plasmonic particles in the curable coating composition preferably form an interface between a conductive surface of the plasmonic particle and a dielectric phase of the curable coating composition.

The plasmonic particles can be free (viz. mobile), such as in suspension in a liquid. They can also be immobilised on the surface of the substrate that needs to be coated. Typical substrates include glass, ceramics, glass ceramics, wood, transparent cellulose foils, paper, metals, and polymers such as poly(methyl methacrylate) (PMMA), polycarbonate (PC), polyethylene terephthalate (PET) and polyethylene naphthalate (PEN).

The plasmonic particles can have morphologies including spherical, elongated, rod-like, cuboidal, pyramidal, plate-like, board-like, oblate, spindle, and nanostars.

The plasmonic particles comprise a electric conducting material, such as a metal or carbon. The plasmonic particles can preferably comprise metal nanoparticles and/or nanoparticles with a metal nanoshell. Suitable metals for any form of particle include one or more selected from the group consisting of Ag, Al, Au, Cu, Ni, Co, Pd, Pt, In, Sn, Zi, Ti, Cr, Ta, W, Fe, Rh, Ir, Ru, Os, and Pb. Preferably, the metals are selected from the group consisting of Ag, Al, Au, Cu, Ni, Co, Pd, Pt, and Rh. The metals may be present as alloys. Also metal-metal core-shell particles are possible. Carbon is advantageous in terms of costs.

Preferably, the plasmonic particles comprise one or more selected from the group consisting of:
(i) metal nanoparticles comprising one or more metals selected from the group consisting of Ag, Al, Au, Cu, Ni, Co, Pd, Pt, Rh,
(ii) core-shell nanop articles comprising a core comprising a dielectric material and a shell comprising one or more metals selected from the group consisting of Ag, Al, Au, Cu, Ni, Co, Pd, Pt, Rh, (iii) core-shell nanoparticles comprising a core comprising one or more metals selected from the group consisting of Ag, Al, Au, Cu, Ni, Co, Pd, Pt, Rh and a shell comprising a dielectric material, and (iv) carbon nanoparticles comprising carbon in an electric conductive form.

Preferably, the plasmonic particles of any composition are dispersed in the thermally curable component.

The plasmonic particles may comprise a shell comprising such metals and a core comprising a material different form the shell. Examples of suitable plasmonic particles include $SiO_2$/Au nanoshells, polymer/silver nanoshells, metal coated chalcogenide II-VI nanoparticles, such as gold coated CdTe nanoparticles and gold coated CdSe nanoparticles. For example, suitable plasmonic particles include $SiO_2$/Au nanoshells prepared by suspending 120 nm silica nanoparticles (e.g. commercially obtainable from Precision Colloids, Inc.) in ethanol, functionalising with 3-aminopropylthriethoxysilane, adding gold colloidal particles (1-3 nm) which are adsorbed on the amine groups and act as seed for growth of the nanoshell by reacting $HAuCl_4$ with the seeds in the presence of formaldehyde (Neumann et al., *ACS Nano* 2013, 7, 42-49). It is further possible that the nanoparticles have a solid metal shell filled with another substance with may be a non-solid. Examples of substances that can be contained in metal shells are insulators or dielectric materials such as water, gases (such as nitrogen, argon and neon), aqueous gels (such as polyacrylamide gels and gels containing gelatine), and organic substances such as ethanol.

The plasmonic particles can also comprise carbon nanoparticles, for example Carbon black N115 commercially available from Cabot, Inc. Graphitic and graphene comprising particles can also be used. A preferred curable composition is in the form of a silica sol-gel formulation wherein metal nanoparticles are dispersed, as in the Example.

Apart from plasmonic particles, the plasmonic structures can also comprise nanostructured surfaces, in particular nanostructured metal surfaces.

Plasmonic heating refers to the dissipation of thermal energy from a plasmonic particle to its environment due to surface plasmon resonance. Without wishing to be bound by any theory, it is believed that the electromagnetic field of the light can result in excitation of surface plasmons by resonant coupling. The energy not re-radiated through light scattering is dissipated, resulting in a temperature increase in the nano- to micrometre-scale vicinity of the particle surface.

Plasmonic heating may result in evaporation of a liquid component of the curable coating composition and the formation of a vapour shell around the plasmonic particle. The formation of a vapour shell around the plasmonic particles affects the plasmonic heating and may result in the formation of nano- or micropores or channels in the resulting coating.

Preferably, the plasmonic heating is localised. Preferably, the plasmonic heating results in heating of the direct proximity of the plasmonic particles (for example up to 2 μm around the plasmonic particles or up to 1 μm around the plasmonic particles). This is to say, preferably the temperature of the plasmonic particles is 20° C. or higher than the bulk temperature of the curable coating composition, preferably at least 50° C. higher, more preferably 100° C. higher. The temperature of plasmonic particles, such as nanoparticle, can be calculated by applying Fourier's law at the particle interface ($P = G \cdot S \cdot (T_p - T_s)$, wherein P represents the power absorbed by the particle, G represents the effective interfacial thermal conductance, S represents the surface area of the particle, $T_p$ represents the particle temperature, and $T_s$ represents the surrounding temperature). The temperature can also be obtained from surface-enhanced Raman scattering (SERS) measurements.

Optionally, the curable composition comprises a liquid component and plasmonic heating comprises the formation of a vapour layer around plasmonic particles. Without wishing to be bound by way of theory, the lower thermal conductivity of the vapour is believed to be able to cause thermal insulation of the plasmonic particle, a temperature increase of the plasmonic particle and further evaporation of liquid components of the reaction mixture.

Based on the Laplace equation, small bubbles have a high internal pressure. For example, a 3 μm bubble has an inner pressure of 2 bar surrounded by water at 1 bar. In an aspect, the plasmonic heating therefore preferably causes the formation of bubbles which provide a high temperature, high pressure environment for chemical reactions involved in curing the curable composition.

Preferably, the cured coating composition comprises an amount of 0.01 to 10 wt. % such as 1-10 wt. % of plasmonic nanoparticles, based on the total weight of the cured coating composition, more preferably 2-7 wt. %. The skilled person can easily determine the mass fraction of plasmonic particles in the cured coating composition by curing the curable coating composition and determining whether the mass fraction of plasmonic particles is within these ranges.

Preferably, the curable coating composition comprises 0.01-10 wt. % of plasmonic particles, based on the weight of the curable coating composition, more preferably 0.1-5 wt. %. Preferably, the curable coating composition comprise 0.1-10 wt. % of plasmonic particles, based on the weight of the curable coating composition absent solvent, more preferably 0.2-8 wt. %.

Preferably, the conductive surface nanoparticles are selected from metal surface nanoparticles, wherein the metal comprises one or more selected from the group consisting of Ag, Al, Au, Cu, Ni, Co, Pd, Pt, and Rh, and wherein the metal surface nanoparticles exhibit a surface plasmon resonance in the range of 250-1500 nm, such as in the range of 300-1000 nm.

Preferably, nanoparticles used as plasmonic particles are modified at their exposed surface to increase stability. Preferably, the nanoparticles comprise stabilisers, for example grafted molecules, for example natural or synthetic polymers, for steric stabilisation. Examples include PVA (polyvinyl alcohol), poly(vinylpyrrolidone) (PVP) and sodium citrate. Preferably, these preferred plasmonic particles comprise surfactants for stabilisation, for example one or more carboxylates, phosphines, amines, thiols, and/or grafted polymer brushes. The nanoparticles may also comprise, as an alternative or in addition, charged compounds as stabilisers for electrostatic stabilisation. Surfactants are preferably used for stabilisation, in particular in case the liquid desiccant composition comprises metal salts in an amount of for example more than 1 wt. %. Moreover, silica-stabilisation of (gold) nanoparticles is also possible.

For the properties and functionality of a coating it is of interest to have the possibility to include thermally labile ingredients such as biomolecules like enzymes, sugars, DNA, antibodies, bacteria, viruses, organic molecules (such as organic dyes), pH indicators, antifouling/antibacterial additives, and/or oligomers/polymers (such as oligo/polyacrylates, oligo/polymethacrylates, oligo/polystyrene, and/or oligo/polycondensates).

Optionally, the curable coating composition comprises a thermolabile component. This thermolabile component can, for instance, be labile at a temperature of 200° C. or less, such as 150° C. or less or 100° C. or less. The thermolabile component is preferably stable at temperatures of up to at least 35° C., more preferably up to at least 50° C.

Hitherto, thermally curable coating compositions could not comprise such components, as the bulk temperature of the coating composition was raised to much higher temperatures during curing, resulting in loss and/or degradation of thermolabile components.

The thermolabile component is different from the thermocurable component. Preferably, the thermolability relates to the loss of properties (in particular functional properties) of the component which are desired in the cured coating.

In a further aspect, the invention relates to a method for curing a curable coating composition comprising plasmonic particles, preferably a curable coating composition as described herein, comprising: exposing the curable coating composition to light comprising electromagnetic waves that are at least partially concentrated by the plasmonic particles.

By exposing the curable coating composition to light comprising electromagnetic waves that are at least partially concentrated by the plasmonic particle, the generally accepted interpretation is that the oscillations of electrons of on the surface of the plasmon particle match those of the electromagnetic field. In other words the electromagnetic waves of the light comprise at least one plasmon resonance frequency of the plasmonic particles. Accordingly, the electromagnetic radiation to which the plasmonic particles are exposed causes a generation of surface plasmons.

The light exposure causes plasmonic heating resulting in curing of the composition at least partly. Preferably, the plasmonic heating is localised at parts of the curable coating composition in the vicinity of the plasmonic particles (typically in a range of several nanometers to microns). Preferably, the method results a throughout cure and preferably in a solid coating that covers the substrate at least partially, typically completely or in a pre-defined pattern. In case of a coating consisting of various parts on the surface of the substrate, the parts typically comprise each a piece of solidified material comprising a plurality of plasmonic particles. Hence, the throughout-cure results in a coating of the substrate rather than in shells around the plasmonic particles.

In an embodiment, the curing can comprise hydrolysis of metal alkoxyde compounds in an alcoholic solution. The reactions of these species comprise hydrolysis of the M-OR moiety and condensation reactions involving the resulting M-OH group. Water can be used to hydrolyse the precursors and acid or bases can be used as catalysts.

The method advantageously allows for efficient cure at low concentrations of plasmonic particles. The method of the invention, for instance enables the provision of scratch-resistant, well-cured sol-gel based coatings on thermolabile substrates. In addition, the method allows for targeted crystallisation induced via local plasmonic heating. This provides superior control over crystallinity and crystal size. The latter is for example of interest for a titanium dioxide coating. In an embodiment, the plasmonic particles become part of the cured coating, thereby providing one or more specific functionalities to the coating. Examples of such functionalities include thermal conductivity, electrical conductivity, colouring and sensing. The method also allows for curing the coating through other layers, such as layers transparent for the light at the plasmon resonance wavelength. The coating can also be cured through a die. The method allows avoiding, at least partly, the shrink and stress associated with conventional thermal curing as the conventional high bulk temperatures can be avoided. In an aspect, the method allows for better control over porosity of the coating by local heating by spatially selective illuminating parts of the curable composition resulting in depolymerisation and/or evaporation. The method can thus comprise inducing porosity in the coating by spatially selective light exposure of the coating. An advantage of the process is, for example, the relatively short curing time, allowing for faster processing. In addition, the coating material is only heated locally and typically for a short time, providing more flexibility in the use of components, in particular thermolabile components in the curable coating composition.

The method may further comprise one or more additional steps selected from: adding a curing catalyst, adding water vapour during curing of sol-gel coatings, microwave assisted curing, ion beam treatment and applying vacuum combined with ultraviolet irradiation.

Preferably, in the method the thermally curable component is matrix for the plasmonic particles, preferably in the form of a continuous phase, preferably such that thee plasmonic particles are uniformly dispersed therein. Preferably the curing involves solidification or hardening of the matrix such that in the cured product, the cured component is still a matrix for the plasmonic particles. Preferably, the method comprises maintaining the substrate temperature of less than 200° C. during curing, preferably in the range of 0-200° C., more preferably in the range of 10-100° C., such as in the range of 15-50° C. The substrate temperature can be measured using a conventional temperature sensor such as a thermocouple. Preferably, the substrate temperature is kept within these ranges during the curing step.

This advantageously provides more energy efficient curing and improved quality of the coating and allows for thermolabile components in the cured coating and/or a thermolabile substrate.

Preferably, the plasmon resonance excitation wavelength is in the range of 250-1500 nm, such as in the range of 300-1000 nm. Preferably, the curable coating composition is exposed to light comprising a wavelength between 300 and 1500 nm. Preferably, the light is spatial non-coherent light. Laser beams are spatial coherent, spatial non-coherent light includes light from divergent light sources such as sunlight, light emitting diode (LED) light, incandescent and luminescent (fluorescent and/or phosphorescent) light.

Preferably, the plasmonic heating of the plasmonic particle is in the range of $10^7$-$10^{16}$ W/m$^3$, such as $10^9$-$10^{14}$ W/m$^3$, for example $10^{10}$-$10^{13}$ W/m$^3$.

Preferably, the light intensity (irradiance) is $10^2$ W/m$^2$ or more, such as $10^2$-$10^9$ W/m$^2$, more preferably $10^3$-$10^8$ W/m$^2$. Preferably, the irradiance is 0.1 Wm$^{-2}$nm$^{-1}$ or more at a plasmon resonance wavelength of the plasmonic particles; such as 0.1-10 Wm$^{-2}$nm$^{-1}$, preferably 0.4-2 Wm$^{-2}$nm$^{-1}$. Herein such a plasmon resonance wavelength is optionally a wavelength wherein the absorption cross-section of the plasmonic particles is more than 0.001 μm$^2$, preferably more than 0.01 μm$^2$. Preferably the light exposure is for at least 1 s, such as at least 10 s, preferably less than 2 hours, such as less than 60 seconds.

Preferably, the absorption cross-section of the plasmonic particles is more than 0.001 μm$^2$ at a plasmon resonance wavelength, such as more than 0.01 μm$^2$, preferably over a range of 100 nm or more, more preferably 500 nm or more within the 300-2500 nm range, preferably within a 380-700 nm range. The exact absorption cross-section to be used depends on the desired application.

Preferably, the method comprises completing the curing in a curing time of 30 minutes or less, preferably 120 seconds or less, more preferably 30 seconds or less. Preferably, the curable coating composition is exposed to light for a time period within these ranges and thereafter the coating has the desired properties such as hardness of the cured coating. Completing the curing refers to the coating obtaining the desired properties. Accordingly, the method advantageously provides fast cure of the coating, compared to conventional thermal curing.

Preferably, the method comprises comprising applying the curable coating composition on a substrate, preferably in the form of a layer. Preferably the method comprises thereafter curing said layer by exposing said layer to said light, hence preferably a subsequent step of illuminating the layer on the substrate with light having the preferred intensity and wavelength.

The coating can for example be applied on a substrate by spin coating, spraying, dipping, blade coating, curtain coating or rolling. The application process can be a batch or continuous process, preferably a continuous process. In case of a continuous process, the composition is preferably applied using a roll-to-roll or roll-to-sheet process.

The composition is preferably applied in the form of a thin film, for example in a thickness of 10 nm to 10 µm, such as in a thickness of 50 nm to 5 µm. Other suitable ranges for the thickness include 1 µm to 5 mm, such as 10 µm to 500 µm, or 10 µm to 100 µm. The composition is typically uniformly applied over the substrate. The substrate is often flat, such as a layer, it can also have a complex shape (in particular with spraying the curable composition). Typical substrates include glass, ceramics, glass ceramics, wood, transparent cellulose foils, paper, metals, and polymers. The composition is typically applied at room temperature. After application, the composition can be dried by solvent evaporation prior to curing. Typically, the cured coating covers a substrate, typically over a surface area of at least 100 µm$^2$, more preferably at least 1 mm$^2$. The substrate is typically not a nanoparticle. The composition of the substrate is typically different from the cured thermally curable component and/or the plasmonic particles.

The method can comprise a step of drying the curable coating composition on a substrate. In this way possibly present solvent can be evaporated and a gel may be formed. Drying can be performed by exposing the curable composition on the substrate to the atmosphere at room temperature. The curable composition may alternatively be heated or exposed to a reduced pressure environment or air flow to accelerate solvent evaporation. It is also possible to dry the coating by exposing the coated composition to an infrared (IR) lamp dryer. The drying may be performed for a time period of typically 1-10 minutes.

The method may further comprise surface treatment of the substrate, such as plasma treatment and/or cleaning the surface.

The substrate can comprise a thermolabile component. This component may be labile at a temperature of 200° C. or less, such as 150° C. or less or 100° C. or less. In an embodiment, the substrate is thermolabile at a temperature of 200° C. or less. For example, the substrate can comprise a thermoplastic material or an enzyme. The thermolabile component is preferably stable at temperatures of up to at least 35° C., more preferably up to at least 50° C.

In an aspect, the invention relates to an article comprising the curable coating composition as described above, wherein the composition is cured. Such articles can be obtained by curing a curable composition as described hereinabove using plasmonic heating as described above.

The article preferably comprises a coated article comprising the cured composition as coating. The article can also comprise an article moulded from the curable coating composition or an article obtained by an additive fabrication method, such as 3D printing. The article is preferably solid.

Accordingly, the article comprises plasmonic particles, typically at or near the surface as part of a coating of the article. These plasmonic particles can provide advantageous functionalities to the article, for example in combination with organic and/or inorganic semiconductor layers. Such functionalities can include optical functionalities and sensor coatings. The coating may comprise a nanostructured coating, such as a nanostructured sol-gel or organic polymer coating. For example, a concentration gradient of active material can be formed during curing. The coating can also be structured, such as provided with a pattern, for example by using a mask when curing the coating by light exposure. Also lithography can be used to structure the coating, such as by using light exposure or using a laser beam.

Accordingly, the method preferably comprises applying the curable composition as a layer on the substrate, preferably in the form of a continuous, uniform layer, and spatially selectively curing said layer to form a patter of coated curing material, by selective exposing the curable composition layer to said light, for example by exposure through a mask or with a scanning laser beam or another form of lithography.

Optionally, the article can comprise a coating comprising plasmonic particles exhibiting plasmonic heating when exposed to ambient light such as sunlight. Such plasmonic heating can increase a rate of a reaction of a catalytically active coating, such as a photocatalytic titanium dioxide coating. Preferably, the article comprises a conductive polymer composite wherein the plasmonic particles provide at least part of the electric conductivity of the polymer composite. The coating preferably comprises dyes and/or thermochromic or thermoresponsive compounds. This provides as advantage that the response of thermo responsive such as thermo chromic compounds is coupled to exposure to light comprising electromagnetic waves that are at least partially concentrated by the plasmonic particles.

Preferably, the article is in the form of a coated substrate, wherein the coating is cured and comprises silica and plasmonic particles. Preferably, the substrate is thermolabile at a temperature of 200° C. or less, such as 150° C. or less or 100° C. or less. Preferably, the article comprises a thermolabile component thermolabile at a temperature of 200° C. or less, such as 150° C. or less or 100° C. or less. The thermolabile component and/or substrate is preferably stable at temperatures up to at least 35° C., more preferably up to at least 50 ° C.

Apart from applying the composition as coating, the curable composition can also be used for preparing a solid article comprising plasmonic particles by moulding, additive manufacturing, 3D printing and the like. The invention also relates to preparing a solid article by solidifying a curable composition comprising a thermally curable component and plasmonic particles by plasmonic heating through: exposing the curable coating composition to light comprising electromagnetic waves that are at least partially concentrated by the plasmonic particles. The article can comprise an optoelectronic device, a plasmonic sensing device, an optical detector.

The invention will now be further elucidated by the following non-limiting example.

EXAMPLE

Silica-stabilised gold nanoparticles were prepared as follows. A gold sol was prepared by addition of $3.4 \times 10^{-3}$ mol of trisodium citrate to $1 \times 10^{-3}$ mol of $HAuCl_4$ at 80° C. After cooling down to room temperature, $4 \times 10^{-3}$ mol of 3-mercaptopropyl trimethoxysilane and 50 ml of a 0.50 wt. % sodium silicate solution was added.

A silica sol-gel was prepared by mixing 1.00 mol of tetraethyl orthosilicate and 10.0 mol of water at a pH of 2 at room temperature. After approximately 10 minutes, the reaction mixture was diluted with ethanol to a silica solids content of 2 wt. %.

The silica-stabilised gold nanoparticles were dispersed in the silica sol-gel formulation in an amount corresponding to 5 wt. % of the final solid silica, providing a curable coating composition.

The curable coating composition was applied by flow coating on a cleaned glass substrate. After solvent evaporation, coatings were cured by 20 s exposure to light from an overhead projector without additional heating. The hardness of the cured coating was measured (Erichsen, Hardness Test Pencil Model 318). This was compared to the hardness of uncured silica and cured silica without gold nanoparticles (see table 1). Surprisingly, a hardness of 5 N, normally obtained after 2 h heat treatment at 300° C. was now obtained after 20 s light exposure. The temperature increase of the substrate due to the light exposure was about 15° C.

TABLE 1

| Sample | Hardness |
| --- | --- |
| Silica uncured without gold nanoparticles | 2N |
| Silica uncured with gold nanoparticles | 2N |
| Silica cured (20 s light exposure) without gold nanoparticles | 2N |
| Silica cured (20 s light exposure) with gold nanoparticles | 5N |
| Silica, thermally cured for 2 hours at 300° C. furnace | 5N |

The invention claimed is:

1. Curable coating composition comprising a thermally curable component and plasmonic particles,
    wherein the plasmonic particles comprise conductive surface nanoparticles in an amount of 0.01-10 wt. % of the curable coating composition,
    wherein the thermally curable component comprises a metal oxide precursor in an amount of 10-99.9 wt. %, by weight of the curable coating composition absent any solvent, and
    wherein the conductive surface nanoparticles comprise one or more selected from the group consisting of:
    (i) metal nanoparticles comprising one or more metals selected from the group consisting of Ag, Al, Au, Cu, Ni, Co, Pd, Pt, Rh,
    (ii) core-shell nanoparticles comprising a core comprising a dielectric material and a shell comprising one or more metals selected from the group consisting of Ag, Al, Au, Cu, Ni, Co, Pd, Pt, Rh,
    (iii) core-shell nanoparticles comprising a core comprising one or more metals selected from the group consisting of Ag, Al, Au, Cu, Ni, Co, Pd, Pt, Rh and a shell comprising a dielectric material, and
    (iv) carbon nanoparticles comprising carbon in an electric conductive form.

2. Curable coating composition according to claim 1, wherein the plasmonic particles exhibit a plasmon resonance excitation wavelength in the range of 350-1500 nm.

3. Curable coating composition according to claim 1, wherein the plasmonic particles are dispersed in the thermally curable component.

4. Curable coating composition according to claim 1, wherein the thermally curable component comprises a metal alkoxide, nitrate, halide and/or carboxylate, in an amount of 10-99.9 wt. %, by weight of the curable coating composition absent a solvent.

5. Curable coating composition according to claim 4, wherein the metal is selected from the group consisting of scandium, yttrium, lanthanum, actinides, lanthanides, titanium, zirconium, hafnium, vanadium, niobium, tantalum, chromium, molybdenum, tungsten, manganese, technetium, rhenium, iron, ruthenium, osmium, cobalt, rhodium iridium, palladium, nickel, copper, zinc, cadmium, aluminium, gallium, indium, silicon, germanium, tin, lead, antimony, and bismuth.

6. Curable coating composition according to claim 1, wherein the thermally curable component comprises one or more selected from the group consisting of tetramethoxysilane, tetraethoxysilane, methyltrimethoxysilane, ethyltrimethoxysilane, methyltriethoxysilane, ethyltriethoxysilane, dimethyldimethoxysilane, dimethyldiethoxysilane, phenyltrimethoxysilane, phenyltriethoxysilane, diphenyldimethoxysilane diphenyldiethoxysilane, trimethoxy aluminate, triethoxy aluminate, tripropoxy aluminate, tetraethoxy aluminate, trimethoxy titanate, tetramethoxy titanate, triethoxy titanate, tetraethoxy titanate, tetrapropoxy titanate, chlorotrimethoxy titanate, chlorotriethoxy titanate, ethyltrimethoxy titanate, methyltriethoxy titanate, ethyltriethoxy titanate, diethyldiethoxy titanate, phenyltrimethoxy titanate, phenyltriethoxy titanate, trimethoxy zirconate, tetramethoxy zirconate, triethoxy zirconate, tetraethoxy zirconate, tetrapropoxy zirconate, chlorotrimethoxy zirconate, chlorotriethoxy zirconate, ethyltrimethoxy zirconate, methyltriethoxy zirconate, ethyltriethoxy zirconate, diethyldiethoxy zirconate, phenyltrimethoxy zirconate, and phenyltriethoxy zirconate.

7. Curable coating composition according to claim 1, further comprising a thermolabile component, which is labile at a temperature of 200 C. or less and stable at a temperature of 35° C. or more.

8. Curable coating composition according to claim 1, comprising a thermally curable component selected from epoxies, (meth)acrylates, and urethanes.

9. Curable coating composition according to claim 1, in a form of a silica sol-gel formulation wherein metal nanoparticles are dispersed.

10. Method for curing the curable coating composition of claim 1, comprising: exposing the curable coating composition to light comprising electromagnetic waves that are at least partially concentrated by the plasmonic particles.

11. Method according to claim 10, wherein the plasmonic particles exhibit a surface plasmon resonance in the range of 350 nm to 1500 nm.

12. Method according to claim 10, wherein the thermally curable component is matrix in a form of a continuous phase in which the plasmonic particles are uniformly dispersed.

13. Method according to claim 10 wherein the method comprises maintaining the composition at a bulk substrate temperature lower than 200° C. during the curing.

14. Method according to claim 10, comprising completing the curing in a curing time of 30 minutes or less.

15. Method according to claim 10, comprising applying the curable coating composition on a substrate in a form of a layer and thereafter curing said layer by exposing said layer to said light.

16. Method for curing a curable coating composition according to claim 10, comprising applying the curable coating composition on a substrate, wherein the substrate comprises a thermolabile component labile at a temperature of 200° C. or less.

17. Method for curing a curable coating composition according to claim 10, comprising applying a concentration gradient of the thermally curable component or using a mask during light exposure so as to form a structured coating.

18. Article comprising the composition of claim 1, wherein the composition is cured.

19. Article according to claim 18 in the form of a coated substrate, wherein the coating is cured and comprises silica and plasmonic particles.

20. Article according to claim 18, wherein said plasmonic particles contribute to one or more functionalities of the articles, wherein said functionalities are selected from the group of thermal conductivity, electrical conductivity, colouring, and sensing.

* * * * *